United States Patent
Yang et al.

(10) Patent No.: US 11,201,243 B2
(45) Date of Patent: Dec. 14, 2021

(54) NANOWIRE STACK GAA DEVICE AND METHODS FOR PRODUCING THE SAME

(71) Applicant: Taiwan Semiconductor Manufacturing Co., Ltd., Hsinchu (TW)

(72) Inventors: Chansyun David Yang, Shinchu (TW); Han-Yu Lin, Nantou (TW); Chun-Yu Chen, Hsinchu (TW); Chih-Ching Wang, Jinhu Township (TW); Fang-Wei Lee, Hsinchu (TW); Tze-Chung Lin, Hsinchu (TW); Li-Te Lin, Hsinchu (TW); Gwan-Sin Chang, Hsinchu (TW); Pinyen Lin, Rochester, NY (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/559,343

(22) Filed: Sep. 3, 2019

(65) Prior Publication Data
US 2021/0066490 A1 Mar. 4, 2021

(51) Int. Cl.
| H01L 29/78 | (2006.01) |
| H01L 21/8234 | (2006.01) |
| H01L 29/66 | (2006.01) |
| H01L 29/417 | (2006.01) |
| H01L 29/06 | (2006.01) |

(52) U.S. Cl.
CPC .... *H01L 29/785* (2013.01); *H01L 21/823431* (2013.01); *H01L 29/0673* (2013.01); *H01L 29/41791* (2013.01); *H01L 29/66795* (2013.01); *H01L 2029/7858* (2013.01); *H01L 2924/13086* (2013.01); *Y10S 977/938* (2013.01)

(58) Field of Classification Search
CPC ............ H01L 29/785; H01L 29/66795; H01L 29/41791; H01L 29/0673; H01L 29/0669; H01L 21/823431; H01L 2029/7858; H01L 2924/13086; Y10S 977/938
See application file for complete search history.

(56) References Cited

U.S. PATENT DOCUMENTS

| 9,236,267 B2 | 1/2016 | De et al. |
| 9,502,265 B1 | 11/2016 | Jiang et al. |
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |

(Continued)

*Primary Examiner* — Galina G Yushina
(74) *Attorney, Agent, or Firm* — Seed IP Law Group LLP

(57) ABSTRACT

The current disclosure describes techniques for forming a gate-all-around device where semiconductor layers are released by etching out the buffer layers that are vertically stacked between semiconductor layers in an alternating manner. The buffer layers stacked at different vertical levels include different material compositions, which bring about different etch rates with respect to an etchant that is used to remove at least partially the buffer layers to release the semiconductor layers.

18 Claims, 12 Drawing Sheets

(56) References Cited

U.S. PATENT DOCUMENTS

| | | | |
|---|---|---|---|
| 2014/0353574 A1* | 12/2014 | Li | H01L 29/7869 |
| | | | 257/9 |
| 2017/0141112 A1* | 5/2017 | Ching | H01L 21/823807 |
| 2020/0287046 A1* | 9/2020 | Frougier | H01L 29/775 |
| 2020/0388681 A1* | 12/2020 | Yamashita | H01L 27/092 |

* cited by examiner

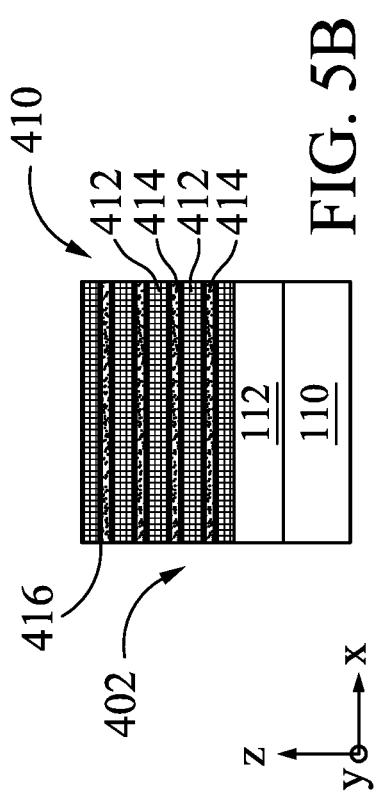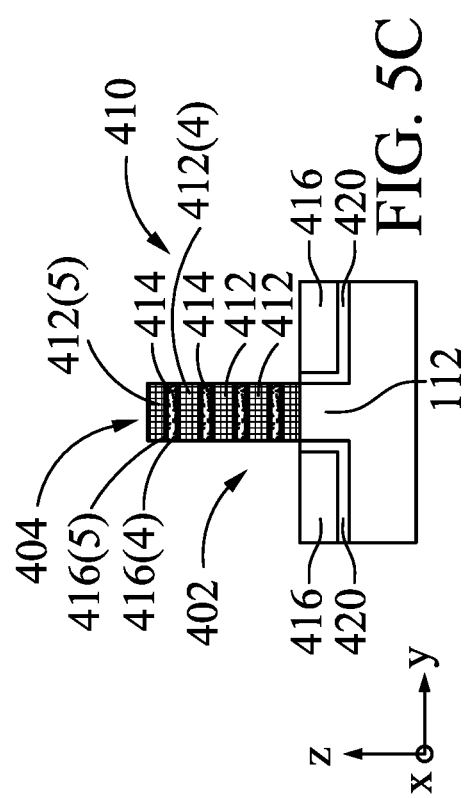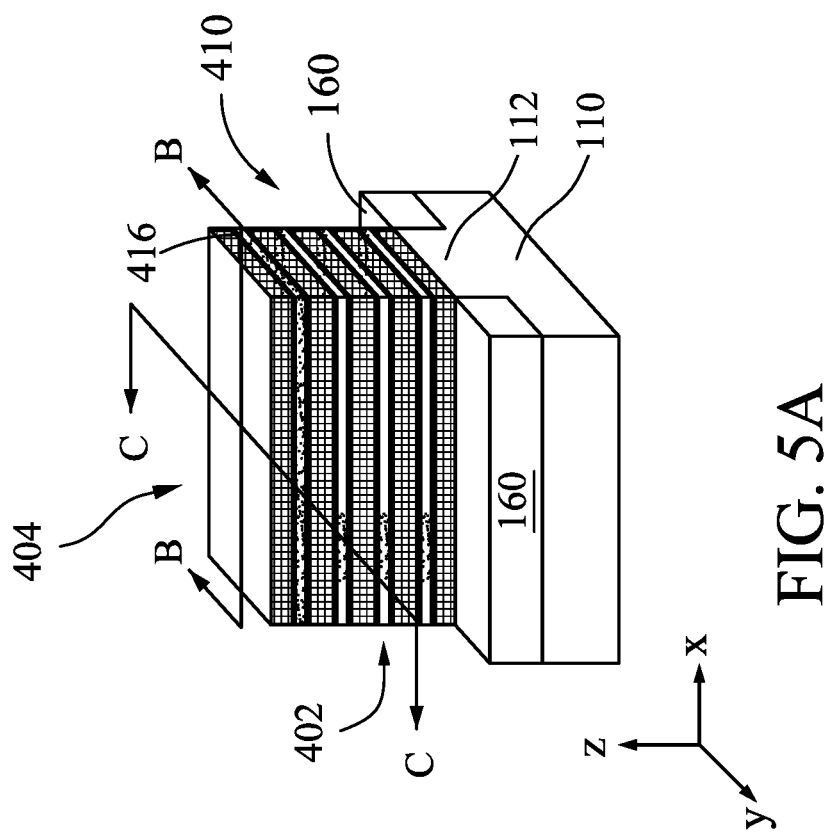
FIG. 5B
FIG. 5C
FIG. 5A

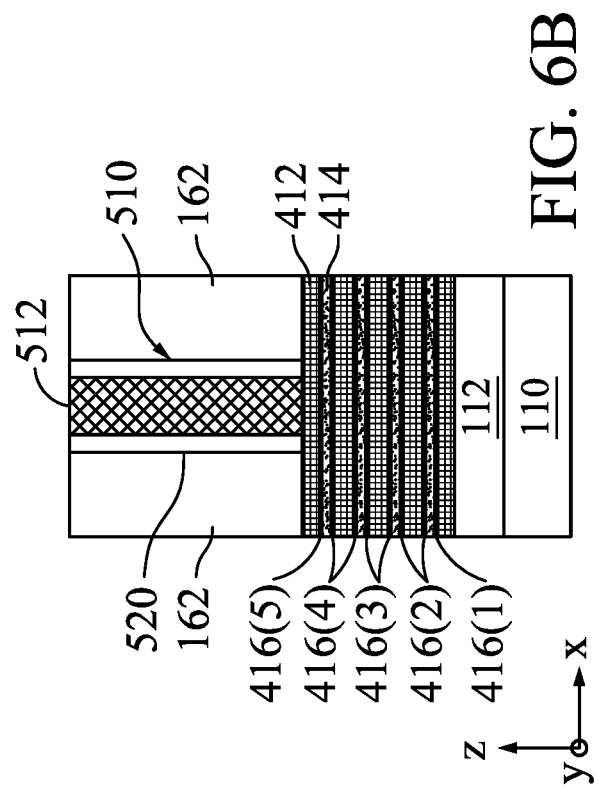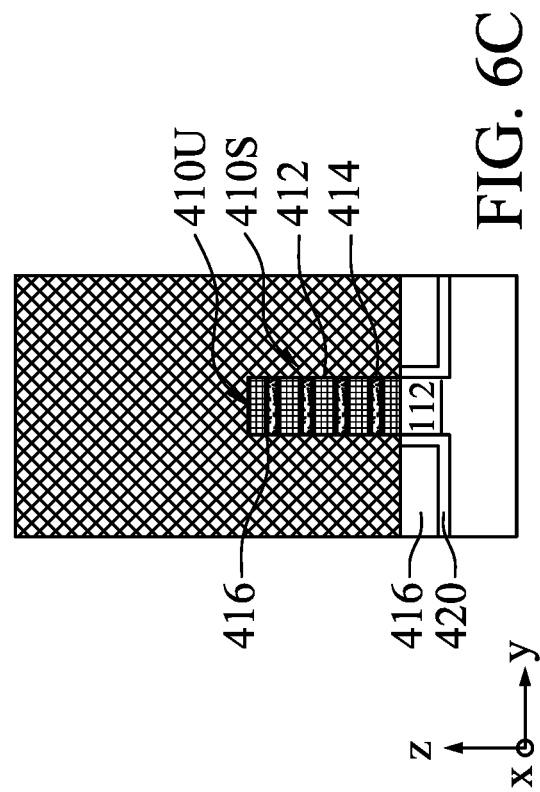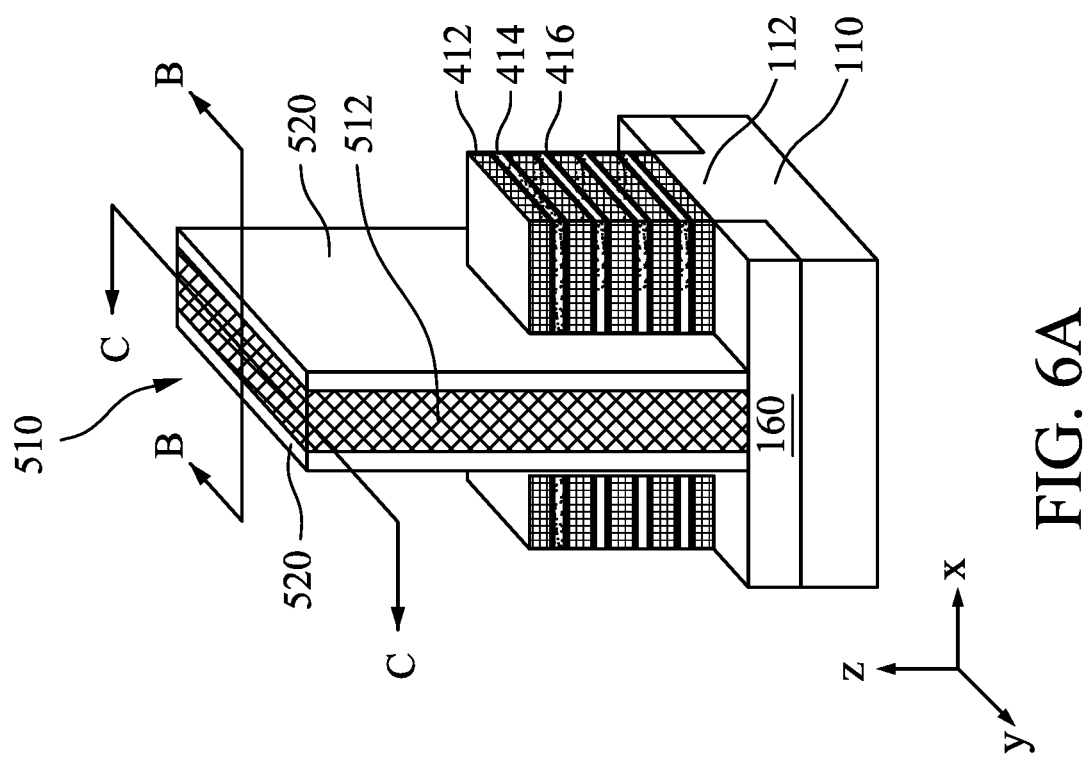

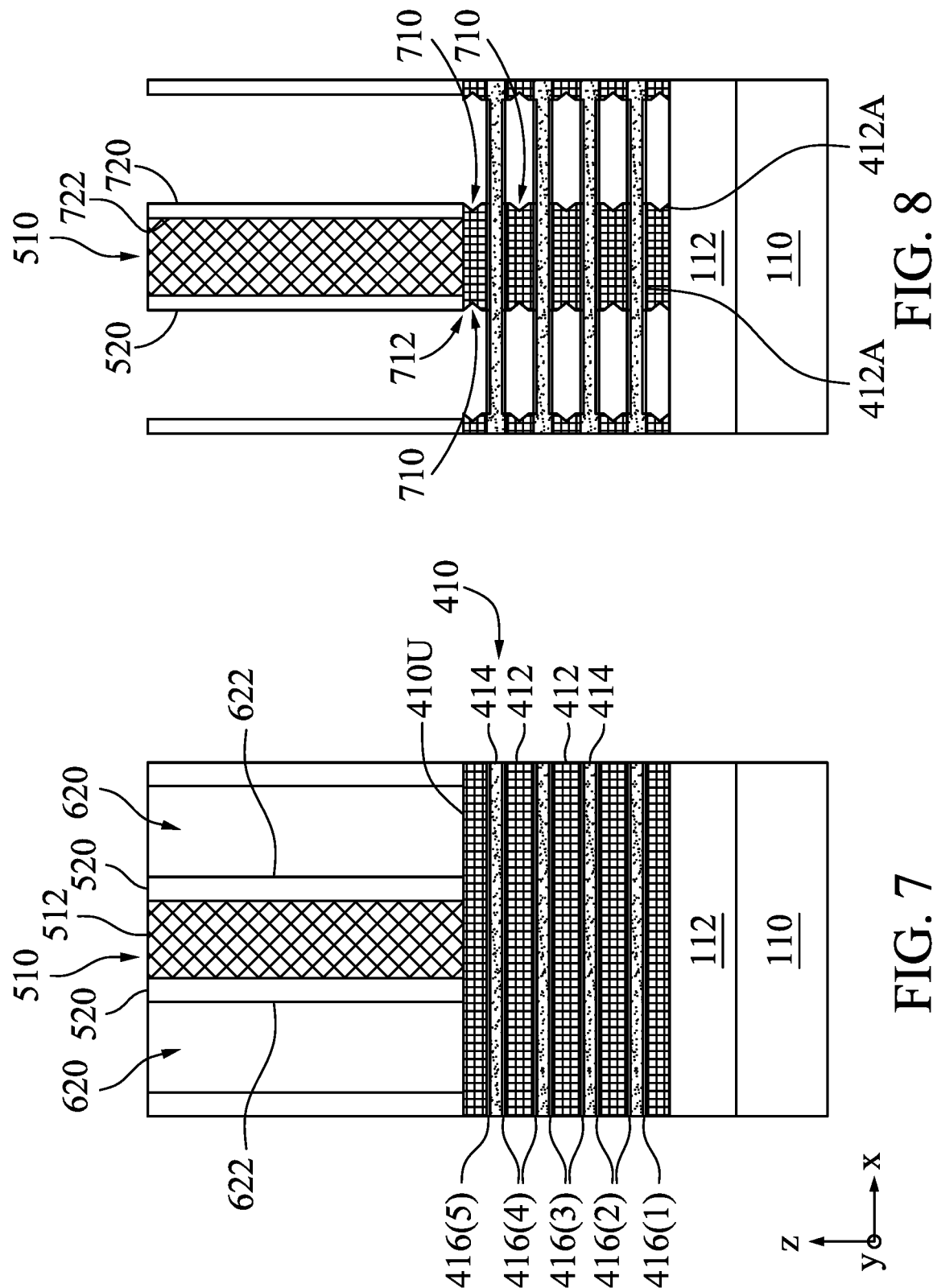

NANOWIRE STACK GAA DEVICE AND METHODS FOR PRODUCING THE SAME

BACKGROUND

Complementary metal oxide semiconductor (CMOS) transistors are building blocks for integrated circuits. Faster CMOS switching speed requires higher drive current, which drives the gate lengths of CMOS transistors down. Shorter gate lengths lead to undesirable "short-channel effects," in which the current control functions of the gates are compromised. FinFET transistors have been developed to, among other things, overcome the short-channel effects. As a further step toward improving electrostatic control of the channels, transistors having wrapped-around gates have been developed, in which a gate portion may surround a semiconductor channel or channel strip from the upper surface and sidewalls thereof.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

FIGS. 3 and 5-13 are perspective views and cross-sectional views of various stages of making the example device of FIGS. 1A-1B according to example embodiments of the disclosure;

DETAILED DESCRIPTION

Figure 1A:
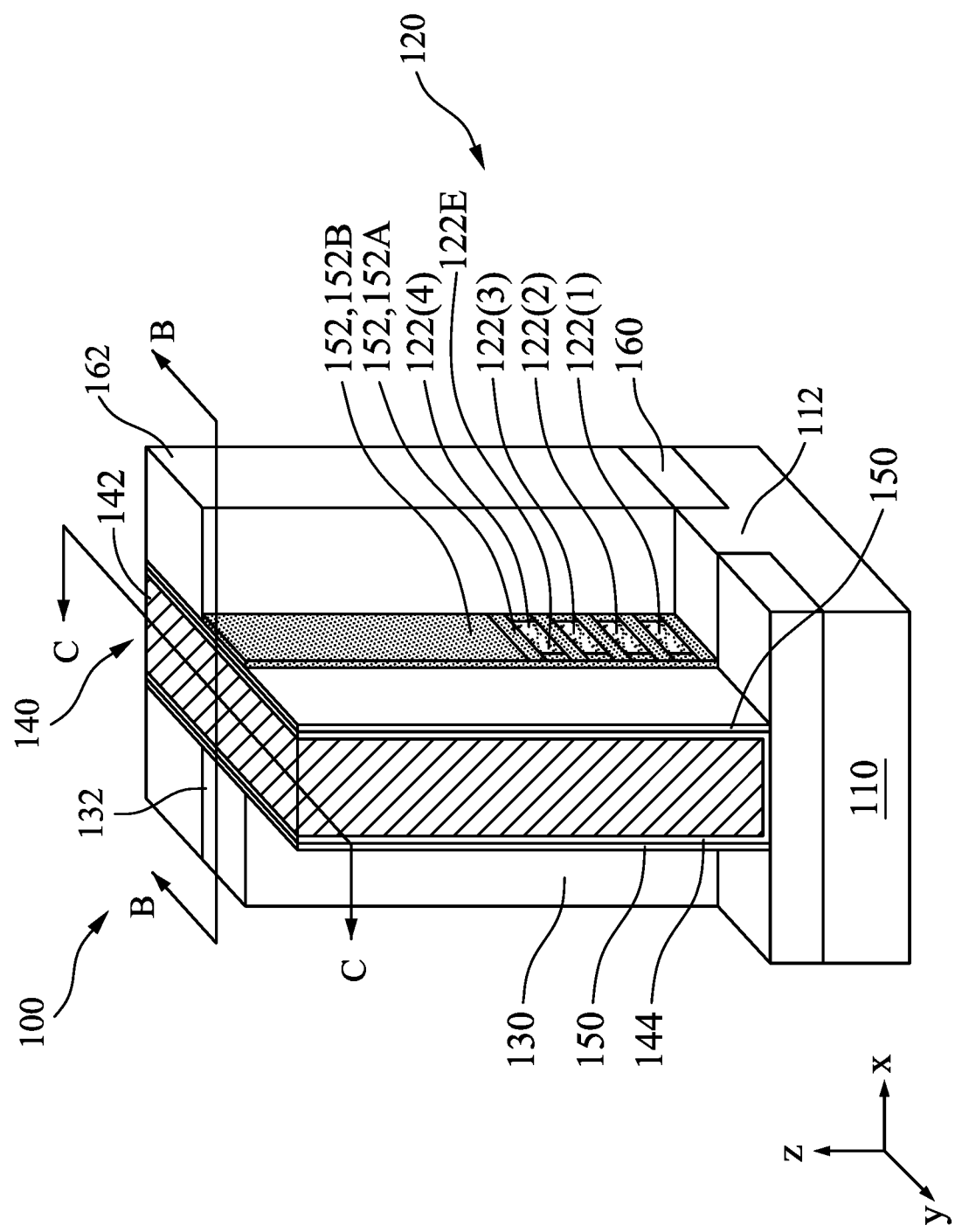
FIGS. 1A-1B are perspective views and cross-sectional views of an example device according to example embodiments of the disclosure.

The current disclosure describes techniques for forming a gate-all-around device where semiconductor layers are released by etching out the buffer layers that are vertically stacked between semiconductor layers in an alternating manner. The buffer layers stacked at different vertical levels include different material compositions, which bring about different etch rates with respect to an etchant that is used to remove at least partially the buffer layers to release the semiconductor layers. The etchant is selective to the semiconductor layer such that the semiconductor layers substantially remain intact after the etching process. In an etching process, the different etch rates of the buffer layers may be used to compensate for the etch amount variations among the vertically stacked buffer layers that are parasitic with the etching process. For example, a wet etching process may be conducted to recede the buffer layers in a lateral direction. In the conventional techniques, where all buffer layers include a same material, a buffer layer that is stacked lower ("lower buffer layer") generally tends to be etched less than a buffer layer that is stacked higher ("upper buffer layer"). As such, the residual receded lower buffer layer may tend to be longer than the upper buffer layer. Under the current techniques, the material of the lower buffer layer may have a higher etch rate than the upper buffer layer. The higher etch rate of the lower buffer layer will compensate for the less etch amount that is natural to the wet etching process. As a result, the wet etching process may remove a substantially same amount of the materials from the lower buffer layer and the upper buffer layer. After the wet etching process, the residual portions of the lower buffer layer and the upper buffer layer may have similar dimensions in the lateral direction. On the other hand, in a dry etching process, a lower buffer layer generally tends to be etched more than an upper buffer layer. Under the current techniques, the material of the lower buffer layer may have a lower etch rate than the upper buffer layer. The lower etch rate of the lower buffer layer will compensate for the higher etch amount that is natural to the dry etching process. As a result, the dry etching process may remove a substantially same amount of the materials from the lower buffer layer and the upper buffer layer. After the dry etching process, the residual portions of the lower buffer layer and the upper buffer layer may have similar dimensions in the lateral direction.

In an embodiment, the buffer layers are silicon germanium. By varying the molar ratios between Si and Ge in the silicon germanium buffer layers, the silicon germanium materials of the different buffer layers react differently to an etchant that is selective to either silicon or germanium. Specifically, a higher Ge concentration in the silicon germanium makes it more reactive to an etchant that is selective to Si. A higher Si concentration in the silicon germanium makes it more reactive to an etchant that is selective to Ge. Silicon germanium buffer layers of different molar ratios between Si and Ge have different etch rates with respect to an etchant selective to either Si or Ge.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1A is a perspective view of a device 100. Referring to FIG. 1A, the device 100 includes a substrate 110 that includes a lower fin structure 112. A stack 120 of discrete nanowire strips 122 ("nanowire stack 120") are formed over the substrate 110 and, more specifically, in an embodiment, over the lower fin structure 112 of the substrate 110. The nanowire stack 120 includes multiple nanowire strips 122 that are stacked vertically, in the z direction, over one another. Two source/drain structures 130 are formed adjacent to and contacting at least some of the nanowire strips 122 by edge surfaces 414E of the contacted nanowire strips 122. Note that in FIG. 1A, one of the source/drain structures 130 is omitted to show the nanowire stack 120, for illustrative purposes. It should be appreciated that in the final device 100, the nanowire stack 120 is not exposed.

A gate structure 140 is formed over the substrate 110. The gate structure 140 includes a gate electrode 142 and a gate dielectric layer 144. In an embodiment, the gate structure 140 is separated from the source/drain structure 130 by a dielectric layer other than the gate dielectric layer 144. The dielectric layer may include one or more of an outer spacer structure 150 and an inner spacer structure 152. Specifically, for example, the inner spacer structure 152 is formed laterally between the source/drain structure 130 and the gate structure 140 in the x axis direction. It should be appreciated that depending on device or process design, an inner spacer 152 may not be a necessary element in the device.

One or more insulation layers 160, 162 are formed adjacent to the source/drain structure 130 and/or the gate structure 140. The insulation layers 160, 162 include silicon oxide, silicon nitride or other suitable dielectric materials. Note that in FIG. 1A, some portions of the insulation layers 160, 162 are omitted to show the source/drain structure 130 and/or the nanowire stack 120, for illustrative purposes only. The insulation layers 160, 162 may be a single layer of a dielectric material, two separately formed layers of a same dielectric material or two layers of different dielectric materials.

FIG. 1A shows, as an illustrative example, that an upper surface 132 of the source/drain structure 130 is substantially at a same level as that of the gate structure 140. This example is not limiting. Depending on design requirements, in other examples, the source/drain structure 130 is higher or lower than the gate structure 140, which are all included in the disclosure.

In an embodiment, the nanowire strips 122 that are adjacent to the gate structure 140 are configured as a channel region(s) of the device 100.

The substrate 110 may include a silicon substrate in crystalline structure and/or other elementary semiconductors like germanium. Alternatively or additionally, the substrate 110 may include a compound semiconductor such as silicon carbide, gallium arsenide, indium arsenide, and/or indium phosphide. Further, the substrate 110 may also include a silicon-on-insulator (SOI) structure. Substrate 110 may include an epitaxial layer and/or may be strained for performance enhancement. The substrate 110 may also include various doping configurations depending on design requirements such as P-type substrate and/or N-type substrate and various doped regions such as P-wells and/or N-wells.

The gate structure 140 is formed as a replacement gate. The following description lists examples of materials for the gate structure 140 including the gate electrode 142 and the gate dielectric 144, which are non-limiting. The gate electrode 142 includes a conductive material, e.g., a metal or a metal compound. Suitable metal materials for the gate electrode 142 include ruthenium, palladium, platinum, tungsten, cobalt, nickel, hafnium (Hf), zirconium (Zr), titanium (Ti), tantalum (Ta), aluminum (Al), aluminides, conductive metal carbides (e.g., hafnium carbide, zirconium carbide, titanium carbide, and aluminum carbide), conductive metal oxides and/or other suitable materials. In some examples, the gate electrode 142 includes a work function adjustment layer tuned to have a proper work function for enhanced performance of the field effect transistor devices. For example, suitable N-type work function metals include Ta, TiAl, TiAlN, TaCN, other N-type work function metal, or a combination thereof, and suitable P-type work function metal materials include TiN, TaN, other P-type work function metal, or a combination thereof. In some examples, a conductive layer, such as an aluminum layer, a copper layer, a cobalt layer or a tungsten layer is formed over the work function layer such that the gate electrode 142 includes a work function adjustment layer disposed over the gate dielectric 144 and a conductive layer disposed over the work function layer and below a gate cap (not shown for simplicity). In an example, the gate electrode 142 has a thickness ranging from about 5 nm to about 40 nm depending on design requirements.

In example embodiments, the gate dielectric layer 144 includes an interfacial silicon oxide layer (not separately shown for simplicity), e.g., thermal or chemical oxide having a thickness ranging from about 5 to about 10 angstrom (Å). In example embodiments, the gate dielectric layer 144 further includes a high dielectric constant (high-K) dielectric material selected from one or more of hafnium oxide ($HfO_2$), hafnium silicon oxide (HfSiO), hafnium silicon oxynitride (HfSiON), hafnium tantalum oxide (HMO), hafnium titanium oxide (HMO), hafnium zirconium oxide (HfZrO), combinations thereof, and/or other suitable materials. A high K dielectric material, in some applications, includes a dielectric constant (K) value larger than 6. Depending on design requirements, a dielectric material of a dielectric contact (K) value of 7 or higher is used. The high-K dielectric layer may be formed by atomic layer deposition (ALD) or other suitable technique. In accordance with embodiments described herein, the high-K dielectric layer of the gate dielectric layer 144 includes a thickness ranging from about 10 to about 30 angstrom (Å) or other suitable thickness.

The outer spacer 150 and/or the inner spacer 152 is formed of a low K dielectric material such as silicon oxynitride ($SiO_xN_y$), silicon nitride ($Si_3N_4$), silicon monoxide (SiO), silicon oxynitrocarbide (SiONC), silicon oxycarbide (SiOC), silicon carbide (SiC), hafnium oxide ($HfO_2$), vacuum and/or other dielectrics or other suitable materials. The outer spacer 150 and/or the inner spacer 152 may be formed through chemical vapor deposition (CVD), high density plasma CVD, spin-on, sputtering, or other suitable approaches. In an example, the inner spacer 152 also includes one or more air gaps adjacent to one or more of the gate structure 140 or the source/drain structure 130.

The inner spacer 152 includes a first segment 152A formed between the gate structure 140 and the source/drain structure 130 and adjacent to a channel region (nanowire strip) 122. In an embodiment, the inner spacer structure 152 also includes a second segment 152B that extends upward adjacent the outer spacer 150. The second segment 152 B of the inner spacer 152 is further away from the channel region 122 than the first segment 152A. In this embodiment, a portion of the source/drain structure 130 may be separated from the gate structure 140 by both the inner spacer 152 (specifically the second segment 152B of the inner spacer 152) and the outer spacer 150.

Figure 1B:
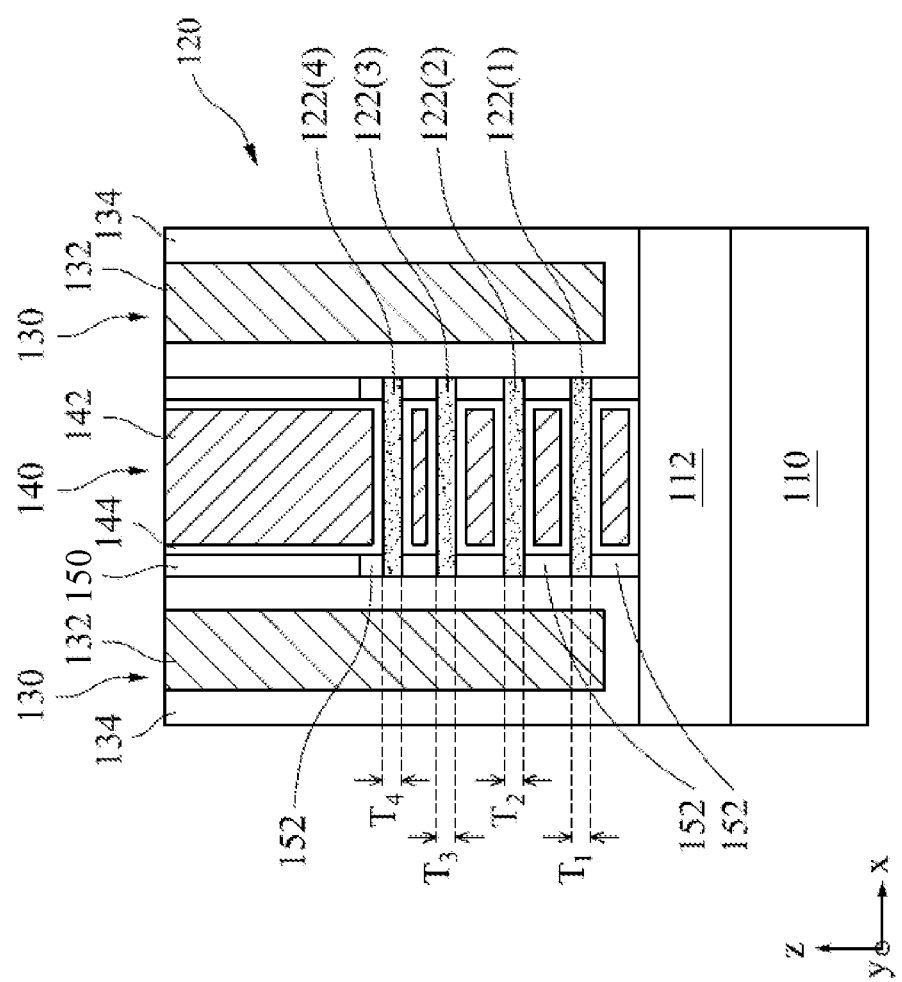

FIG. 1B is a cross-sectional view of the device 100 from cutting-line B-B. As shown in FIGS. 1A and 1B together, the gate structure 140 is adjacent to a nanowire strip 122, shown as four strips 122(1), 122(2), 122(3), 122(4), by at least three surfaces of each of the nanowire strips 122, i.e., the upper surface and the side surfaces. FIG. 1B shows that the gate structure 140 wraps around one or more of the individual nanowire strips 122. As shown in FIG. 1B, both the gate electrode 142 and the gate dielectric 144 wrap around an individual nanowire strip 122, which is not limiting. It is possible that only the gate dielectric 144 wraps around an individual nanowire strip 122 and the gate electrode 142 is adjacent to three surfaces of the nanowire stack 120 as a whole.

The source/drain structure 130 contacts each semiconductor nanowire strips 122. FIG. 1B shows, as an illustrative example, that the source/drain structures 130 contact the edge portions of the semiconductor nanowire strips 122 from a lateral direction, here the x-axis direction. The disclosure is not limited by this specific example. In other embodiments, the second portions of the semiconductor nanowire strips 122 may extend outwardly beyond the spacers 150 or 152 and the source/drain structures 130 may contact the semiconductor nanowire strips 122 from vertical directions, e.g., the z-axis direction. For example, the source/drain structure 130 may wrap around the semiconductor nanowire strips 122. In an embodiment, the source/drain portion 130 may include a source/drain electrode layer 132 and a work function adjustment layer 134, as shown in FIG. 1B.

In an embodiment, the semiconductor nanowire strips 122 are silicon.

In an embodiment, the source/drain structure 130 extends continuously downward from a nanowire strip 122 that is stacked higher in the nanowire stack 120 ("higher nanowire strip 122"), e.g., the nanowire 122(4), to a nanowire strip 122 that is stacked lower in the nanowire stack 120 ("lower nanowire strip 122"), e.g., the nanowire 122(1). The source/drain structure 130 contacts the higher nanowire strip 122 and the lower nanowire strip 122 by the edge surfaces 122E thereof, respectively.

In an embodiment, a thickness of the nanowire strips 122 varies along the vertical direction, here the z-axis direction, in a consistent manner. A thickness of the nanowire strips 122 either continuously increases or continuously decreases along the vertical direction. As shown in FIG. 1B, as an illustrative example, a thickness T1 of the semiconductor nanowire 122(1) is larger than a thickness T2 of the semiconductor nanowire 122(2). The thickness T2 of the semiconductor nanowire 122(2) is larger than a thickness T3 of the semiconductor nanowire 122(3). The thickness T3 of the semiconductor nanowire 122(3) is larger than a thickness T4 of the semiconductor nanowire 122(4). In an embodiment, as shown in FIG. 1B, all the nanowire strip 122 contacts the source/drain structure 130, which is not limiting. In other scenarios, depending on fabrication process and product design, some of the nanowire strips 122, e.g., those stacked on the top of the nanowire stack 120, do not contact the source/drain structure 130. For example, the inner spacer structure 150 may be formed between a topmost nanowire strip 122 and the source/drain structure 130.

Figure 2:
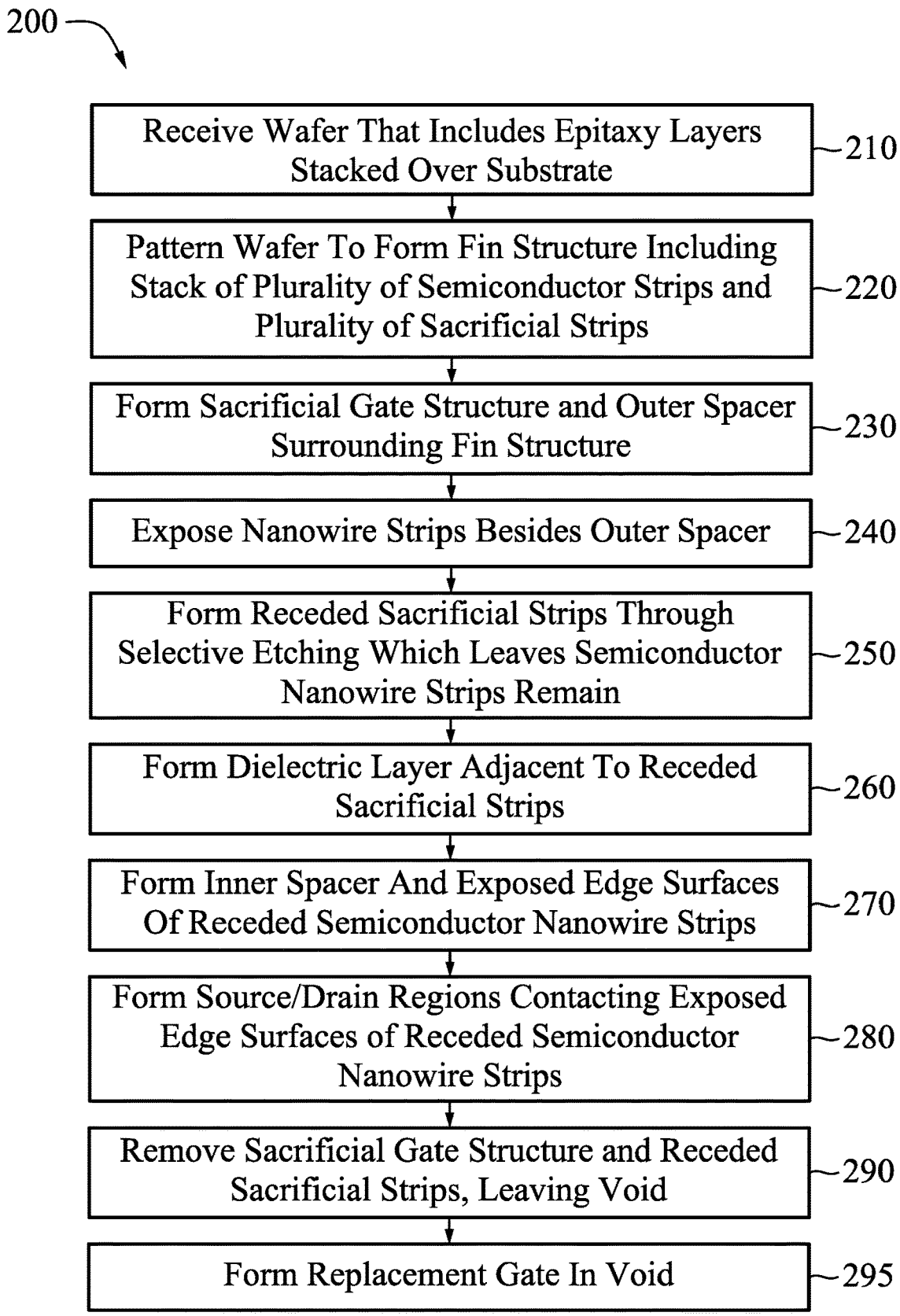
FIG. 2 is a flow chart of an example fabrication process according to example embodiments of the disclosure.

FIG. 2 is an example fabrication process 200, which could be used to make the example device 100 shown in FIGS. 1A-1B and other devices. FIGS. 3 and 5-13 show stages of a wafer 300 in a process of making the example device 100. At each stage, one or more of three views of the wafer 300 are shown, i.e., the perspective view referenced with letter "A", a sectional view from cutting line B-B, referenced with letter "B" and also referred to as "B" plane (X-Z plane), and a sectional view from cutting line C-C, referenced with letter "C" and also referred to as "C" plane. At some of the stages, only one view of the wafer 300 is shown and the reference letter of the respective view will be omitted for simplicity.

Figure 3B:
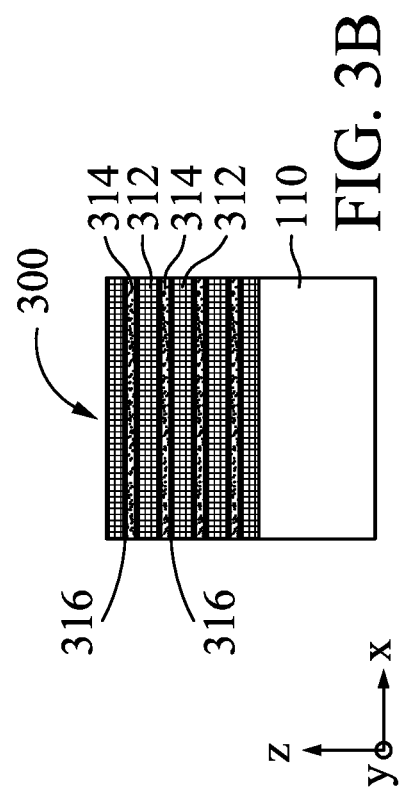
Figure 3C:
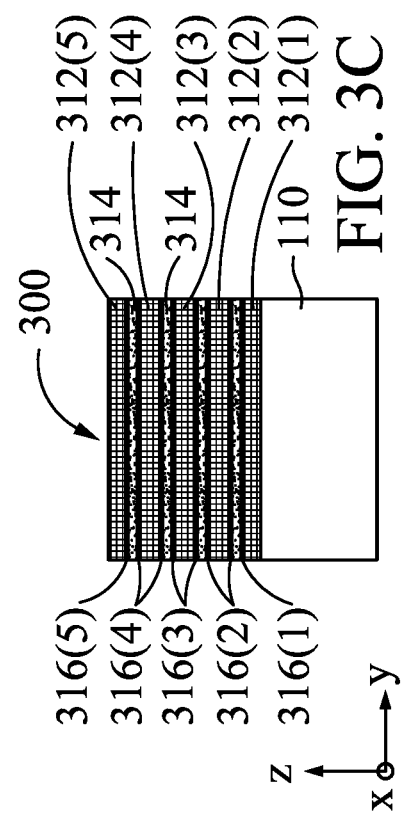
Figure 3A:
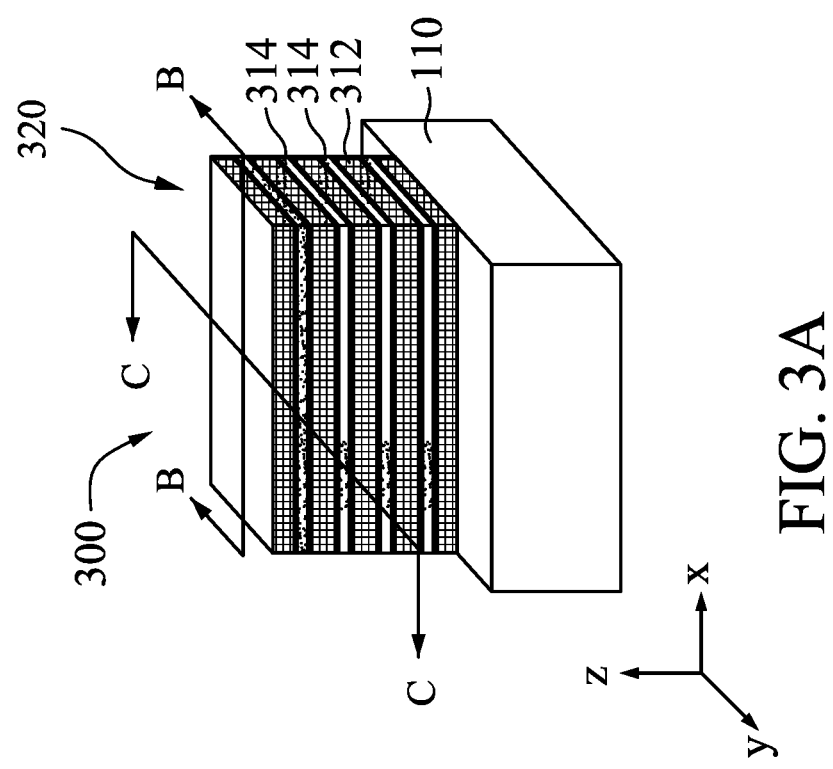

Referring to FIG. 2, with reference also to FIGS. 3A-3C, in example operation 210, a wafer 300 is received. FIGS. 3A-3C illustrate the wafer 300.

The wafer 300 includes a substrate 110, e.g., of silicon, silicon germanium, and/or other suitable semiconductor materials. For example, the substrate 110 may include a compound semiconductor such as silicon carbide, gallium arsenide, indium arsenide, and/or indium phosphide. Further, the substrate 110 may also include a silicon-on-insulator (SOI) structure.

A vertical stack of epitaxy layers 312, 314 of different materials are formed over the substrate 110 and are stacked in an alternating sequence, i.e., each epitaxy layer 312, 314 is immediately and vertically adjacent to a different one of the epitaxy layers 314, 312. FIGS. 3A-3C show, as an illustrative example, that five epitaxy layers 312 and four epitaxy layers 314 are stacked over the substrate 110, which is not limiting. Other numbers of the epitaxy layers 312, 314 are also possible and included in the disclosure. In an embodiment, the wafer 300 includes a same number of the epitaxy layers 312 as the epitaxy layers 314. In another embodiment, the wafer 300 includes a different number of the epitaxy layers 312 from that of the epitaxy layers 314.

In an embodiment, the first semiconductor material and the second semiconductor material have different etching rates with respect to some etchants, i.e., having etching selectivity, such that a selective etching may be conducted to remove one of the epitaxy layers 312, 314 with the other one remaining.

In an embodiment, the substrate 110 is a silicon substrate. The epitaxy layers 314 are one of silicon, germanium or other suitable semiconductor materials. As an illustrative example, the epitaxy layers 314 are silicon. The epitaxy layers 312 are a compound semiconductor material(s) that is different from the semiconductor material of the epitaxy layers 314. The compound semiconductor materials of the epitaxy layers 312 include a first element and a second element with a molar ratio between the first element and the second element. The epitaxy layers 312 include different molar ratios among one another. Because the epitaxy layers 312 include different molar ratios between the first element and the second element, the epitaxy layers 312 have different etch rates among one another with respect to a same etchant.

In an example, the epitaxy layers 312 are silicon germanium of $Si_xGe_{1-x}$, with x being greater than 0 and smaller than 1. The molar ratios between silicon and germanium, or $x/(1-x)$, vary among the epitaxy layers 312. In an embodiment, the molar ratio between silicon and germanium varies gradually among the epitaxy layer 312 based on the relative vertical positions of each epitaxy layers 312 with respect to the substrate 110. For example, the molar rate between silicon and germanium will either gradually increase or gradually decrease among the epitaxy layers 312 in the vertical direction, here the z-axis direction. That is, the molar ratio between silicon and germanium either gradually increases by each silicon germanium layer 312 stacked over a lower silicon germanium layer 312 or gradually decrease by each silicon germanium layer 312 stacked over a lower silicon germanium layer 312.

For example, as shown in FIG. 3, as an illustrative example, the silicon germanium layer 312 includes silicon germanium layers 312(1), 312(2), 312(3), 312(4) and 312(5) stacked vertically from the substrate 110 toward an upper surface 320 of the wafer 300, in an order as listed. In the bottom silicon germanium layer 312(1), i.e., most adjacent to the substrate 110, the silicon germanium composition includes about 88% to about 92% of silicon and about 8% to about 12% of germanium, or about 8.8:1.2 to about 9.2:0.8 in molar ratio between silicon and germanium. In the silicon germanium layer 312(2), i.e., one layer over the bottom silicon germanium layer 312(1), the silicon germanium composition includes about 86% to about 90% of silicon and about 10% to about 14% of germanium, or about 8.6:1.4 to about 9.0:1.0 in molar ratio between silicon and germanium. In the silicon germanium layer 312(3), i.e., one layer over the silicon germanium layer 312(2), the silicon germanium composition includes about 84% to about 88% of silicon and about 12% to about 16% of germanium, or about 8.4:1.6 to about 8.8:1.2 in molar ratio between silicon and germanium. In the silicon germanium layer 312(4), i.e., one layer over the silicon germanium layer 312(3), the silicon germanium composition includes about 82% to about 86% of silicon and about 14% to about 18% of germanium, or about 8.2:1.8 to about 8.6:1.4 in molar ratio between silicon and germanium. In the silicon germanium layer 312(5), i.e., one layer over the silicon germanium layer 312(4), the silicon germanium composition includes about 80% to about 84% of silicon and about 16% to about 20% of germanium, or about 8.0:2.0 to about 8.4:1.6 in molar ratio between silicon and germanium. As such, the molar ratios between silicon and germanium of the silicon germanium layers 312 form a gradient along the vertical direction, e.g., the z-axis direction. The gradient may consistently increase or decrease along the vertical direction.

It is appreciated that silicon germanium has etching selectivity to silicon in etchants of ethylenediamine pyrocatechol (EDP), potassium hydroxide (KOH) and tetramethyl ammonium hydroxide (TMAH) or other suitable dry or wet etchants. Increased germanium concentration in the silicon germanium compound increases the etching selectivity over silicon.

Figure 4:
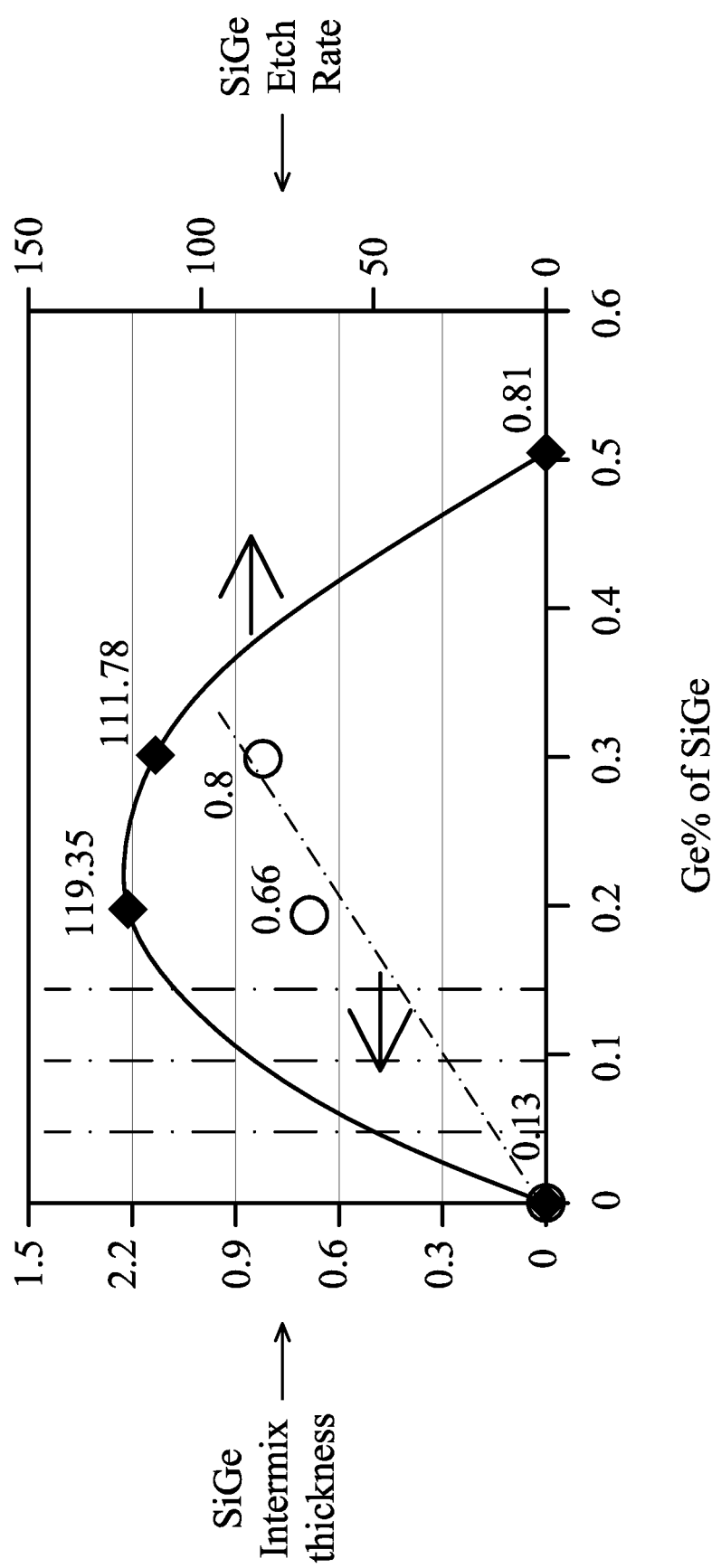
FIG. 4 is an example chart of example experimental data.

FIG. 4 shows example experimental data indicating the variation of silicon germanium etch rates based on the germanium concentration (%) in silicon germanium. The etch rate of silicon germanium tends to increase with increased germanium concentration until the germanium concentration reaches about 20%.

The example silicon germanium compositions of the epitaxy layers 312 are provided for illustrative purposes only and do not limit the scope of the disclosure. Other molar ratios between silicon and germanium or other variations in the molar ratios are possible and included in the disclosure. In an embodiment, the variations in the molar ratios may be determined based on the vertical distances between the adjacent silicon germanium layers 312, here basically equivalent to the thickness of the silicon layer 314 that is stacked between the adjacent silicon germanium layers 312, the parameters of the etching operations designed to selectively remove the silicon germanium layer with respect to the silicon layers 314, or other factors that affects that etch rate of each of the epitaxy layers 312 as positioned in the vertical stack with different heights with respect to the substrate 110.

In an embodiment, the molar ratio gradient may be increased or decreased based on whether a selective wet etching or a selective dry etching operation is used to remove the silicon germanium layers 312. As the silicon germanium layers 312 are stacked in an alternating manner with silicon layers 314, an etchant selective to silicon will have a higher etch rate on a silicon germanium layer 312 that has a higher germanium composition. In an embodiment, a consistent etch rate among all the vertically stacked silicon germanium layers 312 has product design or production design advantages. For a selective wet etching, a silicon germanium layer 312 that is stacked higher, e.g., 312(3), tends to be etched faster than a silicon germanium layer that is stacked lower, e.g., 312(2). To contradict or compensate for this wet etching rate variation effect, the higher stacked silicon germanium layer 312(3) may include less germanium than the lower stacked silicon germanium layer 312(2). On the contrary, for a selective dry etching, the silicon germanium layer 312(3) that is stacked higher tends to be etched slower than the silicon germanium layer 312(2) that is stacked lower. As such, to contradict or compensate for this dry etching rate variation effect, the higher stacked silicon germanium layer 312(3) may include more germanium than the lower stacked silicon germanium layer 312(2).

In an embodiment, the bottom silicon germanium layer 312(1) is formed directly over the silicon substrate 110 using an epitaxy deposition process, e.g., MOCVD, MBE or CVD, using precursors of one or more of silicon tetrachloride (SiCl4), trichlorosilane (SiHCl3), dichlorosilane (SiH2Cl2), or silane (SiH4). For example, a vapor-liquid-solid (VLS) process may be used to deposit nano-scale epitaxy layers under CVD deposition. Then a silicon layer 314 is formed over the silicon germanium layer 312(1) using an epitaxy process. Subsequently, the silicon germanium layers 312 and the silicon layers 314 are formed over the upper surface of the wafer 300 in an alternating manner.

In an embodiment, the parameters, e.g., the conditions and the precursors, of the epitaxy process in forming the silicon germanium layers 312 are adjusted such that each of the silicon germanium layers 312 include a different molar ratio between silicon and germanium. For example, a CVD epitaxy process may be used to grow the silicon germanium layers 312. The growth conditions may include a pressure of 50-200 Torr with a temperature of 550-700° C. The precursor ratio between the Si precursors, e.g., SiH4 or SiH2Cl2, and the Ge precursors, e.g., GeH4, may be controlled to obtain SiGe layers of different Ge concentrations.

In an embodiment, as shown in FIG. 3, as a consequence of the epitaxy process, an interfacial layer of silicon germanium 316 (also referred to as Si/SiGe intermix) is formed between the silicon germanium layer 312 and the adjacent silicon layer 314. The interfacial silicon germanium layers 316 are formed by the germanium atoms of the silicon germanium layers 312 diffusing into the adjacent silicon layers 314. The interfacial silicon germanium layer 316 has a germanium concentration lower than the respective silicon germanium layer 312. For example, for the interfacial silicon germanium layer 316(1) that is adjacent to the silicon germanium layer 312(1), the germanium concentration is smaller than the range of about 8% to about 12% of the silicon germanium layer 312(1). For the interfacial silicon germanium layer 316(2) that is adjacent to the silicon germanium layer 312(2), the germanium concentration is smaller than the range of 10% to about 14% silicon germanium layer 312(2), and is larger than that of the interfacial SiGe layer 316(1). For the interfacial silicon germanium layer 316(3) that is adjacent to the silicon germanium layer 312(3), the germanium concentration is smaller than the range of 12% to about 16% of the silicon germanium layer 312(3), and is larger than that of the interfacial SiGe layer 316(2). For the interfacial silicon germanium layer 316(4) that is adjacent to the silicon germanium layer 312(4), the germanium concentration is smaller than the range of 14% to about 16% of the silicon germanium layer 312(4), and is larger than that of the interfacial SiGe layer 316(3). For the interfacial silicon germanium layer 316(5) that is adjacent to the silicon germanium layer 312(5), the germanium concentration is smaller than the range of 16% to about 20% of the silicon germanium layer 312(5), and is larger than that of the interfacial SiGe layer 316(4). That is, the interfacial silicon germanium layers 316 also have a germanium concentration gradient among them. The interfacial silicon germanium layers 316 adjacent to different silicon germanium layers 312 include different germanium concentrations and different molar ratios between silicon and germanium. Note that for a silicon germanium layer 312, there may be two interfacial layers 316 adjacent thereto from two opposite surfaces of the silicon germanium layer 312 that interface with silicon layers 314. For example, for each of the silicon germanium layers 312(2), 312(3) or 312(4) that interfaces with silicon layers 314 from two surfaces, there are two adjacent interfacial silicon germanium layers 316(2), 316 (3), 316(4), respectively. In the case that the substrate 110 is silicon, an interfacial silicon germanium layer may also be formed between the first silicon germanium layer 312(1) and the substrate 110, which is omitted from FIGS. 3A-3C for simplicity purposes.

As shown in FIG. 4, the thickness of the interfacial silicon germanium layers 316 tends to increase with increased germanium composition until the germanium concentration of the relevant silicon germanium layer 312 reaches 30%.

Referring back to FIG. 3, in an embodiment, the thickness of the interfacial silicon germanium layers 316 may vary based on the molar ratio of the silicon germanium composition. An interfacial silicon germanium layer 316 of a higher molar ratio between silicon and germanium has a smaller thickness than an interfacial silicon germanium layer 316 of a lower molar ratio between silicon and germanium. For example, the interfacial silicon germanium layer 316(1) has a higher molar ratio between silicon and germanium than the interfacial silicon germanium layer 316(2). A thickness of the interfacial silicon germanium layer 316(1) is smaller than a thickness of the interfacial silicon germanium layer 316(2). Similarly, the thickness of the interfacial silicon germanium layer 316(2) is smaller than a thickness the interfacial silicon germanium layer 316(3); the thickness of the interfacial silicon germanium layer 316(3) is smaller than a thickness of the interfacial silicon germanium layer 316(4); and the thickness of the interfacial silicon germanium layer 316(4) is smaller than a thickness of the interfacial silicon germanium layer 316(5).

The epitaxy layers 312, 314 may each be doped in various approaches with various dopants/impurities, like arsenic, phosphorous, boron, gallium, indium, antimony, oxygen, nitrogen, or various combinations thereof.

In an embodiment, the epitaxy layers 312, 314 are each sheets of two-dimensional nanostructures with thicknesses in a scale ranging from about 1nm to about 100 nm. The silicon germanium layers 312 or silicon layers 314 are referred to as silicon germanium nanosheets 312, silicon nanosheets 314, respectively. Each of the nanosheets 312, 314 may include a thickness between about 4 nm to about 20 nm. In some embodiments, the nanosheets 312, 314 may each include a thickness between about 5 nm to about 8 nm.

The epitaxy layers 312, 314 may also be other semiconductor materials that have etching selectivity therebetween. One or both of the epitaxy layers 312 or 314 may be compound semiconductors including two or more elements. Changing the molar ratio between two or more of the elements may result in different etching rate with an etchant that is selective to the other one of the epitaxy layers 312, 314.

The nanosheets 312, 314 may be globally formed over the substrate 110 or may be locally formed over the substrate 110. In a local formation procedure, the nanosheets 312, 314 are formed within an area defined by shallow trench insulation (STI) regions and/or are formed over a doped substrate region, e.g., a P-well or an N-well.

Referring back to FIG. 2, with respect also to FIGS. 5A-5C, in example operation 220, a fin structure 402 is formed by patterning the wafer 300. Any suitable patterning procedures may be used and all are included in the disclosure. The fin structure 402 includes two portions, an upper portion 410 and a lower portion 112. The lower portion 112 is formed from patterning the substrate 110, e.g., of silicon, and is also part of the substrate 110 and is referred to as the "substrate" or the "lower fin portion" or the "lower portion" of the fin, as scenarios apply. The upper portion 410 is formed by patterning the stacked epitaxy layers 312, 314 and the interfacial layers 316. In the example case that the epitaxy layers 312, 314 are nanosheets, the upper fin portion 410 includes nanosheet or nanowire silicon germanium strips 412, and nanosheet or nanowire silicon strips 414 vertically stacked in an alternating manner. Interfacial silicon germanium strips 416 are formed at the interface between nanowire silicon germanium strips 412 and nanosheet or nanowire silicon strips 414. In the description herein, a "nanowire strip" refers to a strip-shaped structure that has an edge surface diameter ranging from about 4 to about 15 nm. A "nanosheet strip" refers to a strip-shaped structure that has an edge surface with a height ranging from about 4 nm to about 10 nm and a width ranging from about 6 nm to about 50 nm. Other dimensional parameters of the strips 412, 414 are also possible. In the description herein, the strips 412, 414 are referred to as "nanowire strips" for descriptive purposes, which does not limit the scope of the disclosure.

The upper fin portion 410, including the stack of the nanowire strips 412, 414, is also referred to as nanowire stack 410. Note that the nanowire stack 410 is different from the nanowire stack 120 of device 100 shown in FIGS. 1A-1B because one group of the nanowire strips 412, 414 will be removed as sacrificial strips, as described herein.

In the following fabrication stages, the silicon germanium nanowire strips 412 will be removed from the nanowire stack 410 and are referred to as the "sacrificial strips" or "buffer strips." The silicon nanowire strips 414 will remain on the nanowire stack 410 and are referred to as the "semiconductor nanowire strips." As illustrative examples, channel strips of nFET or pFET may be formed from the remaining silicon nanowire strips 414. The interfacial silicon germanium strips 416 will also be removed and are referred to as "interfacial buffer strips." Because an interfacial silicon germanium strip 416, e.g., 416(4), includes less germanium concentration than the adjacent silicon germanium strip 412, e.g., 412(4), the etch rate of the interfacial silicon germanium strip 416 is smaller than that of the adjacent silicon germanium strip 412.

A dielectric layer 160 is formed over the substrate 110 and adjacent to the fin structures 402, as shown in FIG. 5A and FIG. 5C. In FIG. 5A and FIG. 5C, portions of the dielectric layer 160 are illustratively removed to show the fin structure 402. It should be appreciated that the dielectric layer 160 may be formed up to the same upper level 404 of the fin structure 402 or may be formed over the fin structures 402. In an embodiment, the insulation layer 160 is silicon oxide, silicon nitride or other suitable dielectric materials. In some embodiments, an etch stop layer 420 is formed between the insulation layer 160 and the substrate 110 including the lower portion 112 of the fin structure 402. The etch stop layer 420 is a different dielectric material from that of the insulation layer 160. In an embodiment, the etch stop layer 420 is silicon nitride or other suitable dielectric materials. In an embodiment, the insulation layer 160 and the etch stop layer 420 are adjacent only to the lower fin portion 112, and the upper fin portion 410 is exposed from the insulation layer 160 and the etch stop layer 420.

Referring back to FIG. 2, with reference also to FIGS. 6A-6C, in example operation 230, a sacrificial gate structure 510 is formed over the substrate 110 and adjacent to or surround three surfaces of the upper fin portion 410, i.e., two side surfaces 410S and an upper surface 410U. In an embodiment, the sacrificial gate structure 510 may include a sacrificial polysilicon layer 512, a sacrificial cap layer (not shown for simplicity), and a sacrificial liner layer (not shown for simplicity). The sacrificial cap layer and the sacrificial liner layer may be silicon oxide or other suitable dielectric materials. The total height of the sacrificial gate structure 510 may be higher or substantially equal to, but not lower than, the replacement gate that is to be made in the space occupied or reserved by the sacrificial gate structure 510.

Optionally, an outer spacer 520 is formed adjacent to the sacrificial gate structure 510. The outer spacer 520 may be silicon nitride or other suitable dielectric materials. The outer spacer 150 is formed of a low K dielectric material such as silicon oxynitride, silicon nitride (Si3N4), silicon monoxide (SiO), silicon oxynitrocarbide (SiONC), silicon oxycarbide (SiOC), silicon mononitride (SiN), vacuum and other dielectrics or other suitable materials. The outer spacer 520 may be formed through chemical vapor deposition (CVD), high density plasma CVD, spin-on, sputtering, or other suitable approaches. In the description herein, the outer spacer 510 is differentiated from an "inner spacer" in that the outer spacer 520 does not extend between the semiconductor strips 414.

In another embodiment, an outer spacer layer is not separately formed and will be formed together with an inner spacer layer as a single layer.

As shown in FIGS. 6A and 6B, the nanowire strips 412, 414 each laterally extend beyond the outer spacer 520 in the x-axis direction.

Before or after the formation of the sacrificial gate structure 510 and the outer spacer 520, another dielectric layer 162 is formed adjacent to the outer spacer 520. The dielectric layer 162 may include a same dielectric material as the dielectric layer 160 or may be a different dielectric material. In an embodiment, the dielectric layer 162 and the dielectric layer 160 is one layer and is formed over the fin structure 402. Specifically, in an embodiment, the dielectric layer 162 may be formed over the dielectric layer 160 and may be patterned together with the dielectric layer 160 to define positions of the sacrificial gate structure 510. Once again, portions of the dielectric layer 160 are illustratively removed for illustration purposes. The insulation layer 162 is omitted from FIG. 5A for illustrative purposes.

FIGS. 7-13 show B plane view of the wafer 300 in the various fabrication stages.

Referring back to FIG. 2, with reference also to FIG. 7, in example operation 240, a trench or aperture 620 is formed within the insulation layer 162 to expose the nanowire stack 410 by each side of the sacrificial gate 510. In an embodiment, a portion 622 of the outer spacer 520 that overlaps the nanowire stack 410 is also exposed. FIG. 7 shows that the aperture 620 stops substantially at the level of the topmost nanowire strip, here the sacrificial nanowire strip 412 (5) of silicon germanium, which is not limiting. In other embodiments, a portion of one or more of the top nanowire strips 412, 414 may be removed. That is, the aperture 620 may extend downward beyond the upper surface 410U of the nanowire stack 410.

Referring back to FIG. 2, with reference also to FIG. 8, in example operation 250, the silicon nanowire strips 414 are released in the source/drain region through the aperture 620. Specifically, a selective etching is conducted through the apertures 620 to selectively remove the sacrificial nanowire strips 412 of silicon germanium exposed from the apertures 620 and to leave the silicon nanowire strip 414 of silicon remaining within the aperture 620. In an embodiment, a chlorine gas $Cl_2$ or $Cl_2$ and nitrogen $N_2$ is used in a dry etching process to selectively etch out the sacrificial silicon germanium strips 412.

According to the nature of the dry etching, a lower silicon germanium layer 412, e.g., the silicon germanium layer 412(1) that is stacked at the bottom of the stack 402, tends to be etched more than higher silicon germanium layer 412, e.g., the silicon germanium layer 412(2) that is stacked higher than the silicon germanium layer 412(1). The molar ratio gradient between silicon and germanium among the silicon germanium layer 412 compensates for this nature effect of dry etching. Specifically, the lower stacked silicon germanium layer 412(1) includes a lower germanium concentration of about 8% to 12%, which brings about a lower etch rate than the higher stacked silicon germanium layer 412(2) that has a higher germanium concentration of about 10% to 14%. This lower etch rate compensates for the dry etching effect that tends to etch more on the lower silicon germanium layer 412(1).

It is appreciated that under a wet etching process, an upper layer tends to be etched more than a lower layer. As such, in a case that a wet etching is used to selectively remove the silicon germanium layers 412, the molar ratio gradient may be formed in a reverse manner such that a silicon germanium layer 412 that is stacked higher, e.g., 412(5), includes a lower germanium concentration than a silicon germanium layer 412 that is stacked lower, e.g., 412(1).

As shown in FIG. 8, after the selective etching process, a recess area 710 may be formed on an edge portion/surface 712 of the recessed silicon germanium layer 412. For simplicity purposes, FIG. 8 shows an example facet effect of the recess 710 on the recessed edge surfaces 712. It should be appreciated that the recess 710 may each be concave-shaped, convex-shaped or may include other facet shapes.

In an embodiment, the etching conditions are controlled such that the edge portions 712 of the recessed silicon germanium layer 412 recede inward beyond the outer surface 720 of the outer spacer 520. In an embodiment, the edge surface 712 of the recessed silicon germanium layer 412 is positioned between the outer surface 720 and the inner surface 722 of the outer spacer 520. In a case that the outer spacer 520 is not formed, the dielectric layers 162, 160 may be patterned in a manner to take over the space of the outer spacer 520. In a case that the trench 620 is formed directly adjacent to the sacrificial gate structure 510, the edge surface 712 of the recessed silicon germanium layer 412 may recede inward beyond the outer surface 820 of the sacrificial gate structure 510.

Figure 9:
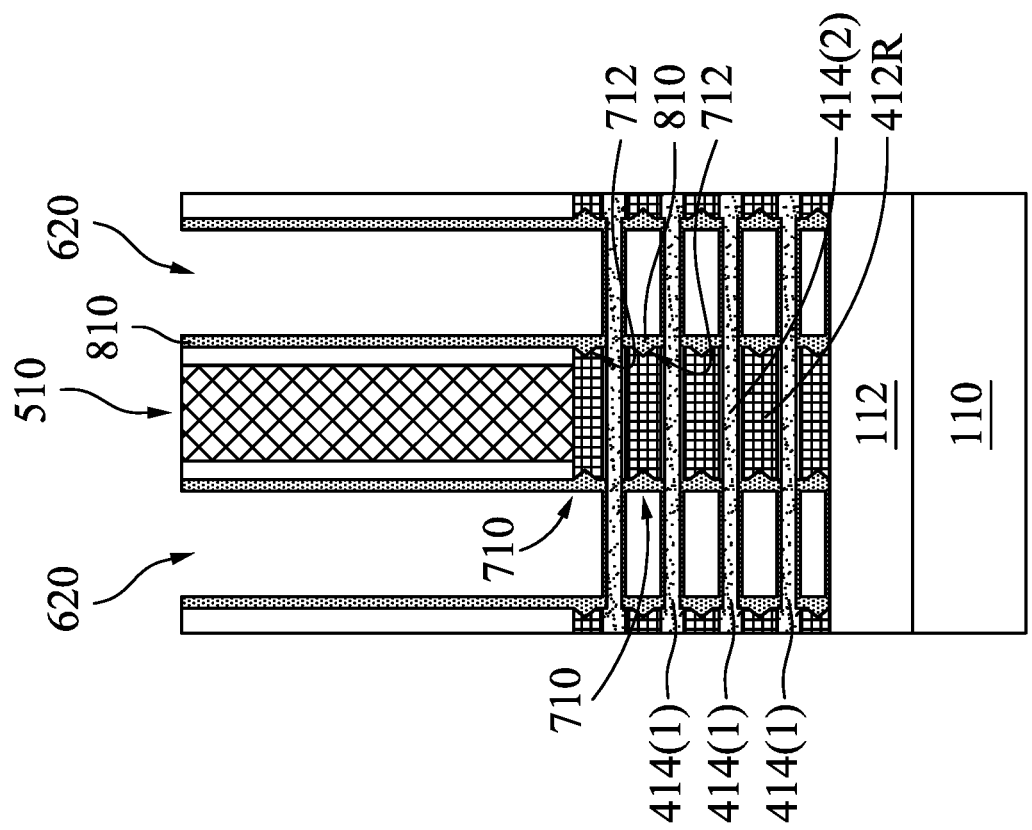

Referring back to FIG. 2, with reference also to FIG. 9, in example operation 260, optionally, a dielectric layer 810 is formed adjacent to the edge portions 712 of the recessed sacrificial strips 412R that remains below the sacrificial gate structure 510. The dielectric layer 810 at least partially fills in the recesses 710 adjacent to the edge surfaces 712. The dielectric layer 810 also covers from a lateral direction, e.g., the x-axis direction, the edge surfaces 714 of the interfacial silicon germanium layer 416.

In an embodiment, the dielectric layer 810 is formed of a dielectric material that has a higher dielectric constant than the outer spacer 520. The dielectric material of the dielectric layer 810 includes one or more of silicon nitride $Si_3N_4$, silicon carbide (SiC), hafnium oxide ($HfO_2$) or other suitable dielectric material. The dielectric layer 810 may be configured to be an inner spacer or spacer.

Figure 10:
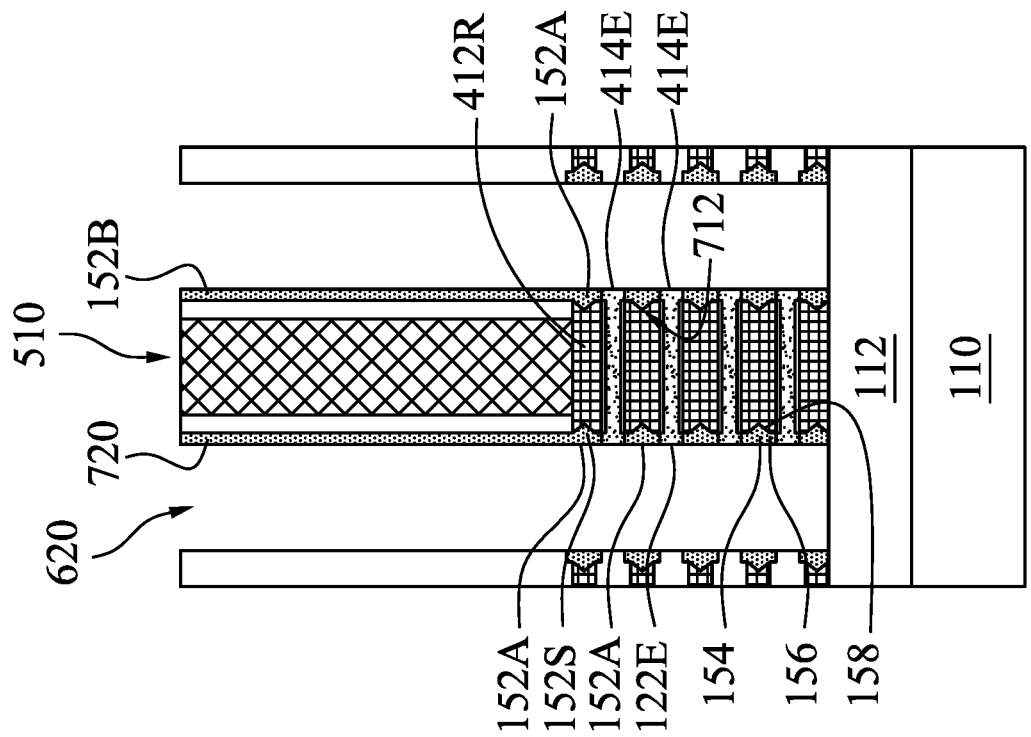

Referring back to FIG. 2, with reference also to FIG. 10, in example operation 270, optionally, inner spacers 152A are further formed by removing extra portions of the dielectric layer 810 through an anisotropic etching. In an embodiment, a resultant surface 152S of the inner spacer 152A, which is distal and opposite to the recessed sacrificial strip 412R, is substantially plumb with the outer surface 720 of the outer spacer 520. In another embodiment, the surface 152S is formed outwardly beyond the outer surface 720 of the outer spacer 520. Further, in an embodiment, a thin layer 152B of the dielectric layer 810 remains adjacent to the outer spacer 520 and may become a second segment 152B of the inner spacer structure 152 (152A+152B). Note that the second segment 152B is technically not an "inner spacer" and is referred to as a second segment of the inner spacer structure 152 only for descriptive purposes.

In an embodiment, the semiconductor nanowire strips 414 are also recessed. The edge surfaces 414E of the plurality of the semiconductor strips are exposed from the inner spacer 152, or specifically the first segment 152A.

In another embodiment, as shown, the silicon nanowire strips 414 within the trench 620 are not removed. That is, selective etching is used to remove portions of the dielectric layer 810 and to keep the silicon nanowire strips 414 substantially intact.

Figure 11:
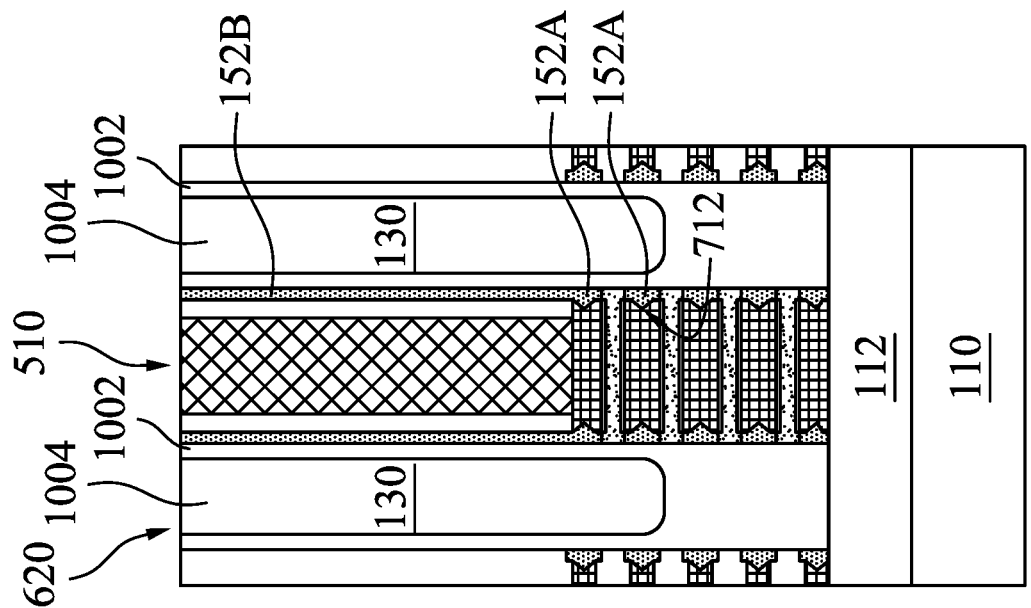

Referring back to FIG. 2, with reference also to FIG. 11, in example operation 280, source/drain structures 130 are formed within the apertures 620. Specifically, the source/drain structures 130 are formed adjacent to the inner spacer 152A (and optionally also 152B) and contacting the edge surfaces 414E of the recessed silicon nanowire strips 414, which are exposed from the inner spacers 152A.

The source/drain structures 130 are formed in the trench 620 adjacent to the sacrificial gate structures 510. As shown in FIG. 10, the source/drain structures 130 are formed within the trench 620 by filling the trench 620 with one or more layers of a conductive material. The conductive material includes one or more of W, Cu, Co, Ti, Ag, Al, TiAl, TiAlN, TaC, TaCN, TaSiN, Mn, Co, Pd, Ni, Re, Ir, Ru, Pt, and Zr, Er, Y, La, or any other suitable conductive materials. In some embodiments, the source/drain structure 2010 includes a first layer or lower contact layer 1002 and a second layer or an upper contact layer 1004. The lower contact layer 1002 directly contacts the edge surfaces 414E of the recessed silicon nanowire strips 414 and the upper contact layer 1004 is formed over the lower contact layer. In some embodiments, the lower contact layer 1002 is configured as a work function adjustment layer. The lower contact layer is Pd, Pt, Ru, Ni, Mg, for pFET or Sc, Er, Y, La, Ni, Mg for nFET. The upper contact layer 1004 is one or more of W, Cu and Co in some embodiments, which are metal materials suitable to be interconnection structures under the back-end-of-line processes. The upper contact layer 1004 may be configured as a source/drain electrode.

In some further embodiments, a third source/drain layer (not shown for simplicity) is formed between the recessed silicon nanowire strips 414 and the lower contact layer 1012. For example, the third source/drain layer may be semiconductor materials to improve the heterojunction with the silicon nanowire strips 414. In the case of nFET devices, the semiconductor materials of the third source/drain layer are silicon carbide (SiC), silicon carbon phosphide (SiCP), silicon phosphide (SiP) or other suitable semiconductor materials. In the case of pFET devices, the semiconductor materials of the third source/drain layer are silicon germanium (SiGe), silicon-germanium-boron (SiGeB) or other suitable semiconductor materials. The semiconductor material of the third source/drain layer may be doped in various approaches with various dopants/impurities, like arsenic, phosphorous, boron, gallium, indium, antimony, oxygen, nitrogen, or various combinations thereof.

In an alternative embodiment, the silicon nanowire strips 414 are not recessed within the trench 620. The source/drain structure 130 wraps around portions of the silicon nanowire strips 414 in the trench 620.

Figure 12:
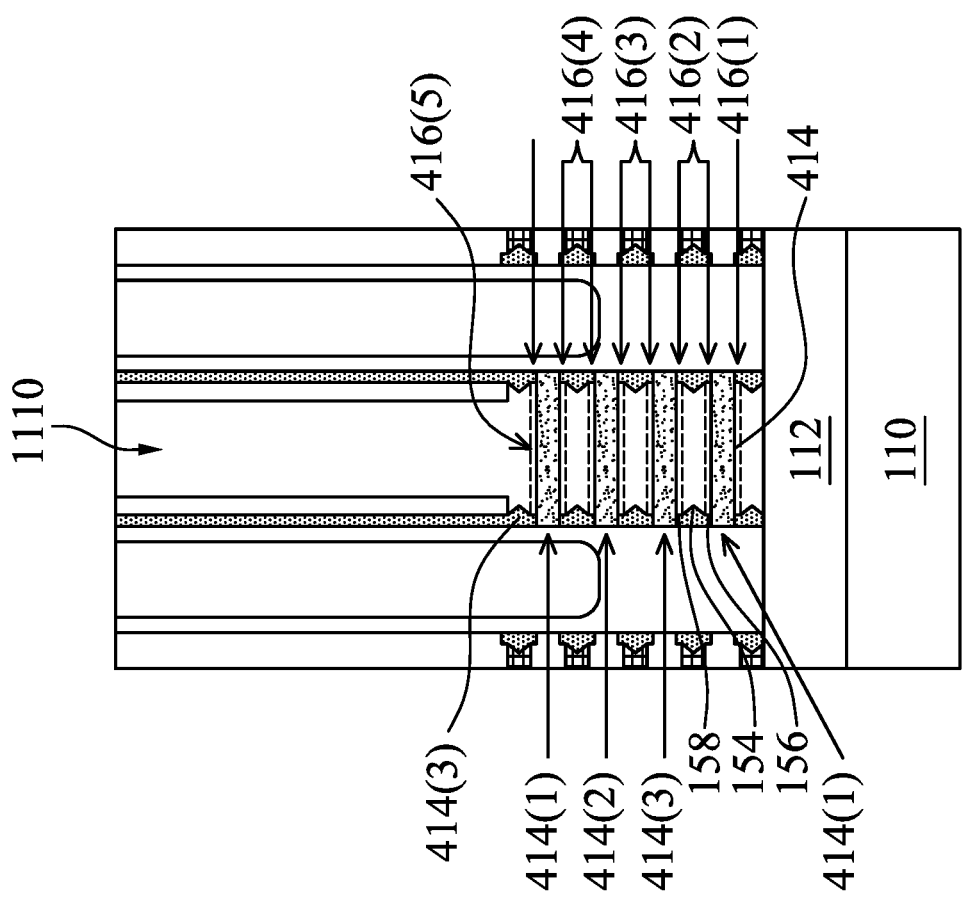

Back to FIG. 2, with reference also to FIG. 12, in example operation 290, the sacrificial gate structure 510 is removed and the silicon nanowire strips 414 are released. Specifically, after the sacrificial gate structure 510 is removed by etching, another selective etching is conducted to remove the receded silicon germanium strips 412. The selective etching may use a same etchant or different etchants from the ones used for removing the silicon germanium strips in the trench 620. After the sacrificial gate structure 510 and the silicon germanium strips 412 are removed, a void 1110 is formed.

In the releasing of the silicon nanowire strips 414, the interfacial silicon germanium layers 416, here 416(1), 416(2), 416(3), 416(4), 416(5), are also removed by the etching. FIG. 12 shows the removed interfacial silicon germanium layers 416 by dotted lines. In an embodiment, because the interfacial silicon germanium layers 416 have different thickness values, the removal of the interfacial silicon germanium layers 416 may form the remaining silicon nanowire strips 414 of different thickness values. Specifically, in an embodiment, the interfacial silicon germanium layers 416(1) is thinner than the interfacial silicon germanium layers 416(2); the interfacial silicon germanium layers 416(2) is thinner than the interfacial silicon germanium layers 416(3); the interfacial silicon germanium layers 416(3) is thinner than the interfacial silicon germanium layers 416(4); and the interfacial silicon germanium layers 416(4) is thinner than the interfacial silicon germanium layers 416(5). The interfacial silicon germanium layers 416(1) and the interfacial silicon germanium layers 416(1) are removed from the silicon nanowire strip 414(1). The interfacial silicon germanium layers 416(2) and the interfacial silicon germanium layers 416(3) are removed from the silicon nanowire strip 414(2). In a case that the silicon nanowire strips 414(1) and 414(2) initially have a same thickness, after the removal of the interfacial silicon germanium layers 416, the silicon nanowire strips 414(1) will have a larger thickness than the silicon nanowire strip 414(2). Similarly, after the removal of the interfacial silicon germanium, the silicon nanowire strips 414(2) will have a larger thickness than the silicon nanowire strip 414(3); the silicon nanowire strips 414(3) will have a larger thickness than the silicon nanowire strip 414(4); and the silicon nanowire strips 414(4) will have a larger thickness than the silicon nanowire strip 414(5).

The thickness variation among the silicon nanowire strips 414 will maintain a consistent trend along the vertical direction. That is, the thickness values of the silicon nanowire strips 414 either consistently increase or consistently decrease along the vertical direction.

In other embodiments, measures may be taken to compensate for this variation in the thickness of the silicon nanowire strips 414 such that after the removal of the interfacial silicon germanium layers 416, the remaining silicon germanium strips 414 have substantially similar thickness.

In another embodiment, because the interfacial silicon germanium layers 416 include less germanium concentration than the adjacent silicon germanium strip 412, some of the silicon germanium materials of the interfacial silicon germanium layers 416 may remain as residuals (which take up the gap area) in the void 1110. The residual silicon germanium materials include different molar ratios between silicon and germanium along the vertical direction, e.g., the z-axis direction, along which the silicon nanowire strips 414 are stacked.

Figure 13:
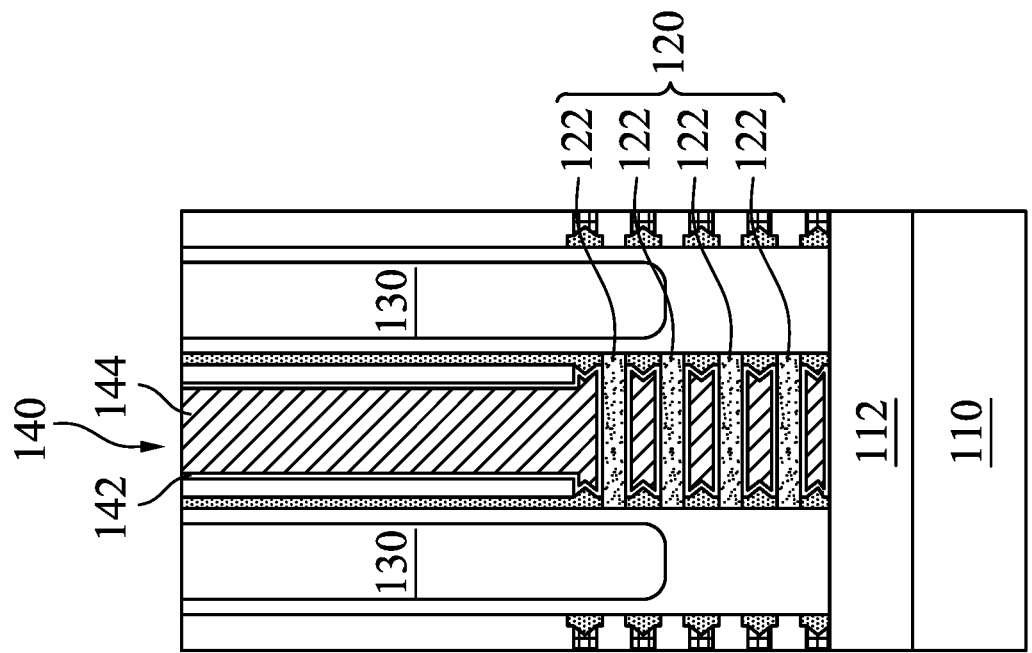

Referring back to FIG. 2, with reference also to FIG. 13, in example operation 295, a replacement gate structure 140, including a gate electrode 142 and a gate dielectric 144, is formed within the void 1110. The replacement gate structure 140 wraps around portions of the silicon nanowire strips 414 in the void 1110, which are configured to be the channel strips of the device.

In an alternative example, the gate structure 140 may be formed before the source/drain structures 130. More specifically, the silicon germanium strips 412 are first removed in the gate region and the inner spacer structure in the gate region before the silicon nanowire strips are released in the source/drain region.

After the formation of the gate structures 140, a device is formed. The device includes gate structure 140, source/drain structures 130 and channel regions 122 formed from silicon nanowire strips 414. In an embodiment, as the gate structure 140 wraps around at least some of the channel strips 122, the device is a gate-all-around ("GAA") device. Because of the variations in the molar ratio among the silicon germanium strips 412 along the vertical direction, the etch rate differences of the selective etching processes are compensated for. For example, a dry etching process tends to etch out more silicon germanium strips 412 stacked lower in the vertical direction than a silicon germanium strip 412 stacked higher in the vertical direction. The lower silicon germanium strip 414 includes less germanium concentration to compensation for this. As a result, the amount of the silicon germanium strips 412 removed in the source/drain releasing process or the gate releasing process are substantially uniform. As a result, the lengths of gate structures 140 between the respective inner spacers 152A are substantially uniform. That is, the gate controls of the adjacent channel strips 412 are substantially uniform. Such a uniform gate control enables better device configuration and performance.

Figure 14:
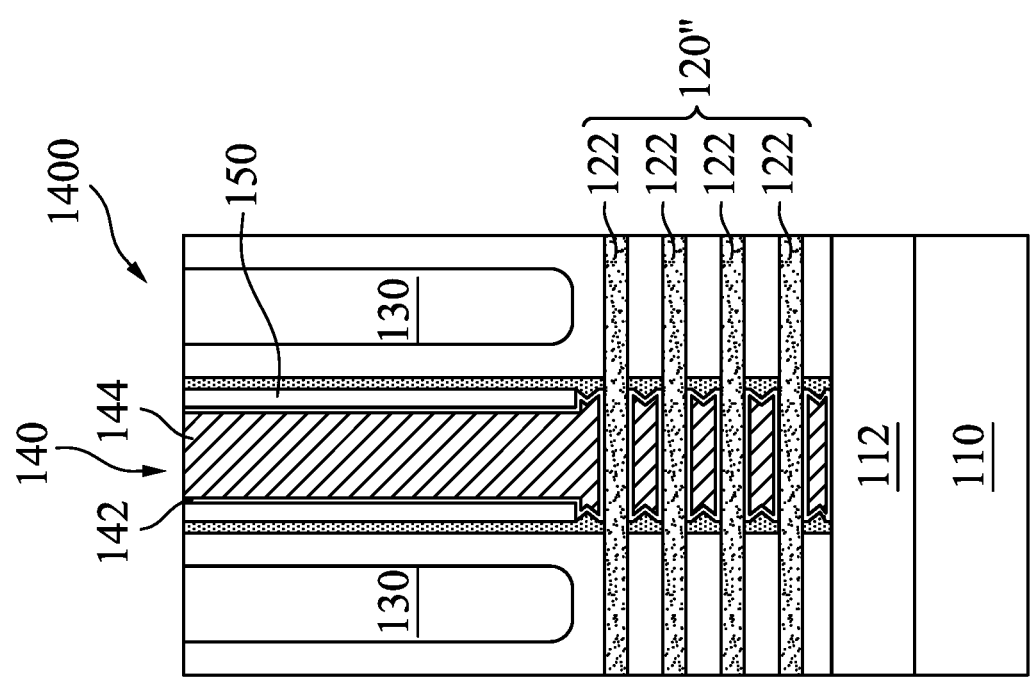
FIG. 14 shows an alternative and/or additional embodiment of an example device according to example embodiments of the disclosure.

FIG. 14 shows another alternative and/or additional structure 1400. In the structure of FIG. 14, the silicon nanowire strips 414 are not receded and remain extending, as channel strips 122 (or together as a channel stack 122"), outward beyond the outer spacer 150 and/or the inner spacer 152. The source/drain regions 130 are formed surrounding, or wrapping around, the silicon nanowire strips 414.

In an embodiment, the silicon nanowire strips 414 are used as channel strips for nFET devices and for pFET devices. In another embodiment, after the channel releasing process of FIG. 11, a thin film of germanium is formed over the silicon nanowire strips 414. The resultant silicon germanium nanowire strips are used as channel strips for pFET devices.

Other variants are also possible and included in the disclosure. Further, the embodiments and the components thereof may be combined in various ways, which are also included in the disclosure.

The present disclosure may be further appreciated with the description of the following embodiments.

A structure embodiment includes a substrate and a vertical stack of semiconductor strips over the substrate. The vertical stack of semiconductor strips includes a first semiconductor strip of a first semiconductor material and a second semiconductor strip of the first semiconductor material. The second semiconductor strip is separated from the first semiconductor strip in a vertical direction. The structure also includes a gate structure adjacent to a first portion of the first semiconductor strip and a first portion of the second semiconductor strip. A source/drain structure contacts a second portion of the first semiconductor strip and a second portion of the second semiconductor strip. The first semiconductor strip includes a different thickness from that of the second semiconductor strip.

In another embodiment, a semiconductor structure includes a substrate, a first buffer layer over the substrate, a first semiconductor layer of a first semiconductor material over the first buffer layer, a second buffer layer over the first semiconductor layer, and a second semiconductor layer of the first semiconductor material over the second buffer layer. The second buffer layer has a different etch rate from the first buffer layer with respect to an etchant that is selective to the first semiconductor material.

In a method embodiment, a wafer is provided. The wafer includes a stack of layers over a substrate. The stack of layers includes a plurality of semiconductor layers and a plurality of buffer layers stacked in an alternating sequence. The plurality of buffer layers includes a first buffer layer and a second buffer layer that have different material compositions. A fin structure is formed by patterning the wafer. The fin structure includes a stack of a plurality of semiconductor strips and a plurality of buffer strips. A source/drain region of the plurality of semiconductor strips is released by removing portions of the plurality of the buffer strips that are adjacent to the source/drain region. A source/drain structure is formed contacting the source/drain region of the plurality of semiconductor strips. A channel region of the plurality of semiconductor strips is released by removing portions of the plurality of the buffer strips that are adjacent to the channel region. A gate structure is formed adjacent to the channel region of the plurality of semiconductor strips.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A structure, comprising:
   a substrate;
   a vertical stack of semiconductor strips over the substrate, the vertical stack of semiconductor strips including:
      a first semiconductor strip of a first semiconductor material;
      a second semiconductor strip of the first semiconductor material, the second semiconductor strip being separated from the first semiconductor strip in a vertical direction;
      first residual material on a lower surface of the first semiconductor strip having a first molar ratio between a second semiconductor material and the first semiconductor material; and
      second residual material on a lower surface of the second semiconductor strip having a second molar ratio between the second semiconductor material and the first semiconductor material that is different from the first molar ratio;
   a gate structure adjacent to a first portion of the first semiconductor strip and a first portion of the second semiconductor strip, the gate structure including:
      a gate electrode; and
      a gate dielectric layer extending along lateral sidewalls of the gate electrode;
   a source/drain structure contacting a second portion of the first semiconductor strip and a second portion of the second semiconductor strip;
   a first spacer layer laterally between the gate structure and the source/drain structure, and including:
      a first spacer portion between the first semiconductor strip and the second semiconductor strip;
      a second spacer portion above the vertical stack; and
      a third spacer portion extending from the first spacer portion to the second spacer portion; and
   a second spacer layer laterally between the gate structure and the first spacer layer;
   wherein the first semiconductor strip includes a different thickness from that of the second semiconductor strip.

2. The structure of claim 1, wherein the second portion of the first semiconductor strip substantially aligns vertically with the second portion of the second semiconductor strip.

3. The structure of claim 1, wherein the gate structure wraps around the first portions of both the first semiconductor strip and the second semiconductor strip, separately.

4. The structure of claim 1, wherein the second portions of the first semiconductor strip and the second semiconductor strip are edge portions that contact the source/drain structure in a lateral direction.

5. The structure of claim 1, wherein the source/drain structure wraps around each of the second portions of the first semiconductor strip and the second semiconductor strip.

6. A structure, comprising:
   a substrate;
   a vertical stack of semiconductor strips over the substrate, the vertical stack of semiconductor strips including a first semiconductor strip of a first semiconductor material and a second semiconductor strip of the first semiconductor material, the second semiconductor strip separated from the first semiconductor strip in a vertical direction, the first semiconductor strip having a different thickness from that of the second semiconductor strip;
   a gate structure surrounding a first portion of the first semiconductor strip and a first portion of the second semiconductor strip, the gate structure including:
      a gate electrode; and
      a gate dielectric layer along lower and lateral walls of the gate electrode;
   a first dielectric layer having:
      a lower portion surrounding a second portion of the first semiconductor strip and a second portion of the second semiconductor strip, the lower portion including facets between the first semiconductor strip and the second semiconductor strip; and
      an upper portion over the lower portion;

a source/drain structure contacting the first semiconductor strip and the second semiconductor strip, the upper portion of the first dielectric layer laterally separating the source/drain structure from the gate structure; and a second dielectric layer between the upper portion of the first dielectric layer and the gate dielectric layer.

7. The structure of claim 6, wherein the second dielectric layer contacts the gate structure.

8. The structure of claim 6, wherein the source/drain structure contacts an edge portion of each of the first semiconductor strip and the second semiconductor strip.

9. The structure of claim 6, wherein the source/drain structure wraps around each of the first semiconductor strip and the second semiconductor strip.

10. The structure of claim 1, wherein the second semiconductor strip is between the first semiconductor strip and the substrate, and the first semiconductor strip is thicker than the second semiconductor strip.

11. The structure of claim 10, wherein:
the vertical stack further includes a third semiconductor strip and a fourth semiconductor strip;
the third semiconductor strip is between the second semiconductor strip and the substrate;
the fourth semiconductor strip is between the third semiconductor strip and the substrate;
the second semiconductor strip is thicker than the third semiconductor strip; and
the third semiconductor strip is thicker than the fourth semiconductor strip.

12. The structure of claim 6, wherein the second semiconductor strip is between the first semiconductor strip and the substrate, and the second semiconductor strip is thicker than the first semiconductor strip.

13. The structure of claim 12, wherein:
the vertical stack further includes a third semiconductor strip and a fourth semiconductor strip;
the third semiconductor strip is between the second semiconductor strip and the substrate;
the fourth semiconductor strip is between the third semiconductor strip and the substrate;
the third semiconductor strip is thicker than the second semiconductor strip; and
the fourth semiconductor strip is thicker than the third semiconductor strip.

14. A structure, comprising:
a substrate;
a vertical stack of semiconductor strips over the substrate, the vertical stack including:
a first semiconductor strip of a first semiconductor material; and
a second semiconductor strip of the first semiconductor material, the
second semiconductor strip between the first semiconductor strip and the substrate;
a gate structure surrounding a first portion of the first semiconductor strip and a first portion of the second semiconductor strip, the gate structure including:
a gate electrode;
a gate dielectric layer including a high-k dielectric material, wherein the gate dielectric layer separates the gate electrode from the vertical stack and extends along lateral sidewalls of the gate electrode; and
an interfacial layer, wherein the interfacial layer separates the gate dielectric layer including a high-k dielectric material from the vertical stack;
a first dielectric layer extending along lateral sidewalls of the gate dielectric layer, and including a first low-k dielectric material;
a source/drain structure contacting the first semiconductor strip and the second semiconductor strip, the first dielectric layer separating the source/drain structure from the gate structure; and
a second dielectric layer laterally between the first dielectric layer and the source/drain structure;
wherein a thickness of each of the first and second semiconductor strips varies in a consistent manner along a vertical direction.

15. The structure of claim 14, wherein the first dielectric layer includes:
a first spacer portion between the first semiconductor strip and the second semiconductor strip;
a second spacer portion above the vertical stack;
a third spacer portion extending from the first spacer portion to the second spacer portion; and
a fourth spacer portion extending from the first spacer portion to the second spacer portion, wherein the first semiconductor strip separates the third spacer portion from the fourth spacer portion.

16. The structure of claim 14, wherein the second dielectric layer—includes a second low k dielectric material.

17. The structure of claim 14, wherein the interfacial layer is an interfacial silicon oxide layer.

18. The structure of claim 14, wherein the gate dielectric layer wraps around the first semiconductor strip and the second semiconductor strip, and the gate electrode layer is adjacent three surfaces of the vertical stack.

* * * * *